(12) United States Patent
Jeon et al.

(10) Patent No.: US 10,391,673 B2
(45) Date of Patent: Aug. 27, 2019

(54) WIRE SAWING APPARATUS

(71) Applicant: SK SILTRON CO., LTD., Gumi-si, Gyeongsangbuk-do (KR)

(72) Inventors: Ji Won Jeon, Gumi-si (KR); Sang Min An, Gumi-si (KR)

(73) Assignee: SK SILTRON CO., LTD., Gyeongsangbuk-do (KR)

( * ) Notice: Subject to any disclaimer, the term of this patent is extended or adjusted under 35 U.S.C. 154(b) by 0 days.

(21) Appl. No.: 15/544,234

(22) PCT Filed: Jan. 7, 2016

(86) PCT No.: PCT/KR2016/000115
§ 371 (c)(1),
(2) Date: Jul. 17, 2017

(87) PCT Pub. No.: WO2016/122130
PCT Pub. Date: Aug. 4, 2016

(65) Prior Publication Data
US 2017/0361494 A1    Dec. 21, 2017

(30) Foreign Application Priority Data

Jan. 26, 2015  (KR) .................. 10-2015-0011896

(51) Int. Cl.
*B28D 5/00*  (2006.01)
*B28D 5/04*  (2006.01)
(Continued)

(52) U.S. Cl.
CPC ........... *B28D 5/0076* (2013.01); *B28D 5/007* (2013.01); *B28D 5/0082* (2013.01); *B28D 5/045* (2013.01);
(Continued)

(58) Field of Classification Search
CPC ........... B23D 57/0007; B23D 57/0023; B23D 57/003; B23D 61/18; B28D 5/042;
(Continued)

(56) References Cited

U.S. PATENT DOCUMENTS 6,145,499 A      11/2000  Tsuchishima
6,945,242 B2 *    9/2005  Kondo ............... B23D 57/0053
                                              125/21
(Continued)

FOREIGN PATENT DOCUMENTS

CN    103407006       11/2013
CN    203712893 U      7/2014
(Continued)

OTHER PUBLICATIONS

Chinese Office Action dated Jul. 25, 2018 issued in Application No. 201680007171.4 (with English translation).
(Continued)

*Primary Examiner* — Timothy V Eley
(74) *Attorney, Agent, or Firm* — KED & Associates LLP

(57) ABSTRACT

A wire sawing apparatus of one embodiment comprises: a wire for cutting an ingot; an ingot conveyor unit for conveying the ingot to the wire; a nozzle for supplying slurry to the wire; and a dispersed slurry blocking unit disposed above the ingot sawed by the wire, so as to absorb at least a part of the slurry dispersed from the lateral sides of the ingot cut by the wire.

19 Claims, 18 Drawing Sheets

(51) Int. Cl.
  *H01L 21/48* (2006.01)
  *H01L 21/78* (2006.01)
(52) U.S. Cl.
  CPC .............. *H01L 21/48* (2013.01); *H01L 21/78* (2013.01); *Y02P 70/179* (2015.11)
(58) Field of Classification Search
  CPC ...... B28D 5/045; B28D 5/007; B28D 5/0076; B28D 5/0082; H01L 21/78
  See application file for complete search history.

(56) References Cited

U.S. PATENT DOCUMENTS

| | | | | |
|---|---|---|---|---|
| 7,025,054 | B2* | 4/2006 | Kondo | B23D 57/0053 125/21 |
| 8,752,537 | B2* | 6/2014 | Kim | B28D 5/045 125/16.02 |
| 2011/0048396 | A1 | 3/2011 | Fukuda et al. | |
| 2013/0327308 | A1 | 12/2013 | Jeon | |

FOREIGN PATENT DOCUMENTS

| | | |
|---|---|---|
| JP | 2000-117726 | 4/2000 |
| JP | 2007-273711 | 10/2007 |
| JP | 2008-302618 | 12/2008 |
| JP | 2009-113173 | 5/2009 |
| JP | 2011-051025 | 3/2011 |
| JP | 4839137 | 12/2011 |
| JP | 2012-024866 | 2/2012 |
| JP | 5768650 | 8/2015 |
| KR | 10-2010-0104760 | 9/2010 |
| KR | 10-1185683 | 9/2012 |

OTHER PUBLICATIONS

International Search Report (with English Translation) and Written Opinion dated Apr. 21, 2016 issued in Application No. PCT/KR2016/000115.
Korean Notice of Allowance dated Dec. 3, 2016 issued in Application No. 10-2015-0011896.
Chinese Office Action dated Mar. 20, 2019 issued in Application No. 201680007171.4.

* cited by examiner

WIRE SAWING APPARATUS

CROSS-REFERENCE TO RELATED PATENT APPLICATIONS

This application is a U.S. National Stage Application under 35 U.S.C. § 371 of PCT Application No. PCT/KR2016/000115, filed Jan. 7, 2016, which claims priority to Korean Patent Application No. 10-2015-0011896, filed Jan. 26, 2015, whose entire disclosures are hereby incorporated by reference.

TECHNICAL FIELD

Embodiments relate to a wire sawing apparatus.

BACKGROUND ART

In order to acquire a wafer from a monocrystalline silicon ingot, there is a wire sawing apparatus that saws the ingot using a wire. An existing wire sawing apparatus saws an ingot by moving a wire at a high speed while supplying slurry to the wire, thereby acquiring a desired shape of wafer.

However, slurry that is dispersed from the region at which the ingot and the wire are in contact with each other at the initial stage, at which the ingot begins to be sawn, falls free, whereas slurry that is dispersed from the region at which the ingot and the wire are in contact with each other from the middle stage after the initial stage, does not fall free, but has a harmful effect on the sawing of the ingot, thereby causing high warpage. Warpage is one of important qualities with regard to the cutting of a semiconductor wafer, and must be further reduced to meet demand for increased product quality.

Technical Object

Embodiments provide a wire sawing apparatus having reduced warpage.

Technical Solution

A wire sawing apparatus according to an embodiment may include a wire configured to cut an ingot, an ingot conveyor unit configured to convey the ingot to the wire, a nozzle configured to supply slurry to the wire, and a dispersed slurry blocking unit disposed above the ingot that is sawn by the wire and configured to absorb at least some of the slurry dispersed from a lateral surface of the ingot that is cut by the wire.

The dispersed slurry blocking unit may have a mesh structure that absorbs the dispersed slurry.

The dispersed slurry blocking unit may include an upper portion attached to a support surface that supports the ingot conveyor unit, a lower portion including at least one mesh plate configured to absorb the dispersed slurry, and a lateral portion between the upper portion and the lower portion.

The upper portion and the lateral portion may be screwed together, and the lower portion and the lateral portion may be integrated.

The dispersed slurry blocking unit may include a slurry accommodation space defined by the upper portion, the lateral portion, and the lower portion and configured to store the dispersed slurry therein, and the lower portion of the dispersed slurry blocking unit may be spaced apart from the ingot with an opening interposed therebetween, the opening being configured to allow introduction of the dispersed slurry into the slurry accommodation space.

A distance between a bottom of the lower portion and a top of the ingot may range from 1 cm to 2 cm.

The dispersed slurry blocking unit may further include an outlet port configured to discharge the slurry stored in the slurry accommodation space in a direction perpendicular to a direction in which the wire moves.

The at least one mesh plate may include a plurality of mesh plates stacked one above another, and a size of openings in the mesh plates may be reduced with increasing distance from the wire.

The dispersed slurry blocking unit may be attachable or detachable. The upper portion of the dispersed slurry blocking unit may be fixed to the support surface, and at least one of the lateral portion or the lower portion of the dispersed slurry blocking unit may be shaped to be attachable to or detachable from the upper portion.

The lower portion of the dispersed slurry blocking unit may be inclined in an inward direction toward the ingot. The lower portion may have an inclination angle ranging from 7° to 10°.

A bottom of the dispersed slurry blocking unit may be located higher than the wire.

The dispersed slurry blocking unit may be disposed at both a side that the wire enters and a side that the wire exits.

The dispersed slurry blocking unit may be disposed parallel to the ingot in a longitudinal direction of the ingot.

The ingot conveyor unit may include a feed table configured to lower the ingot toward the wire, a holder configured to fix the ingot to the feed table, and a beam element configured to connect the holder and the ingot to each other.

The wire sawing apparatus may further include a wire roller having a groove configured to wind the wire and guide the wire, a slurry tank configured to accommodate the slurry to be supplied to the nozzle, a slurry bath configured to accommodate the slurry that has been outletted from the nozzle and used to saw the ingot, a first bobbin configured to wind the wire that is used to saw the ingot, a second bobbin configured to wind the wire that has sawn the ingot, and at least one pulley configured to change a movement path of the wire.

Advantageous Effects

A wire sawing apparatus according to an embodiment may reduce the warpage of a wafer by minimizing over-cooling of an ingot due to the re-introduction of dispersed slurry.

BEST MODE

Hereinafter, embodiments will be described in order to concretely describe the disclosure, and will be described in detail with reference to the accompanying drawings in order to assist in understanding of the disclosure. However, the embodiments disclosed here may be altered into various other forms, and the scope of the disclosure should not be construed as being limited to the described embodiments. The embodiments disclosed here are provided in order to more completely describe the disclosure to those of ordinary skill in the art.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

In addition, relative terms such as, for example, "first", "second", "upper" and "lower", used in the following description may be used to distinguish any one substance or element with another substance or element without requiring or containing any physical or logical relationship or sequence between these substances or elements.

Figure 1:
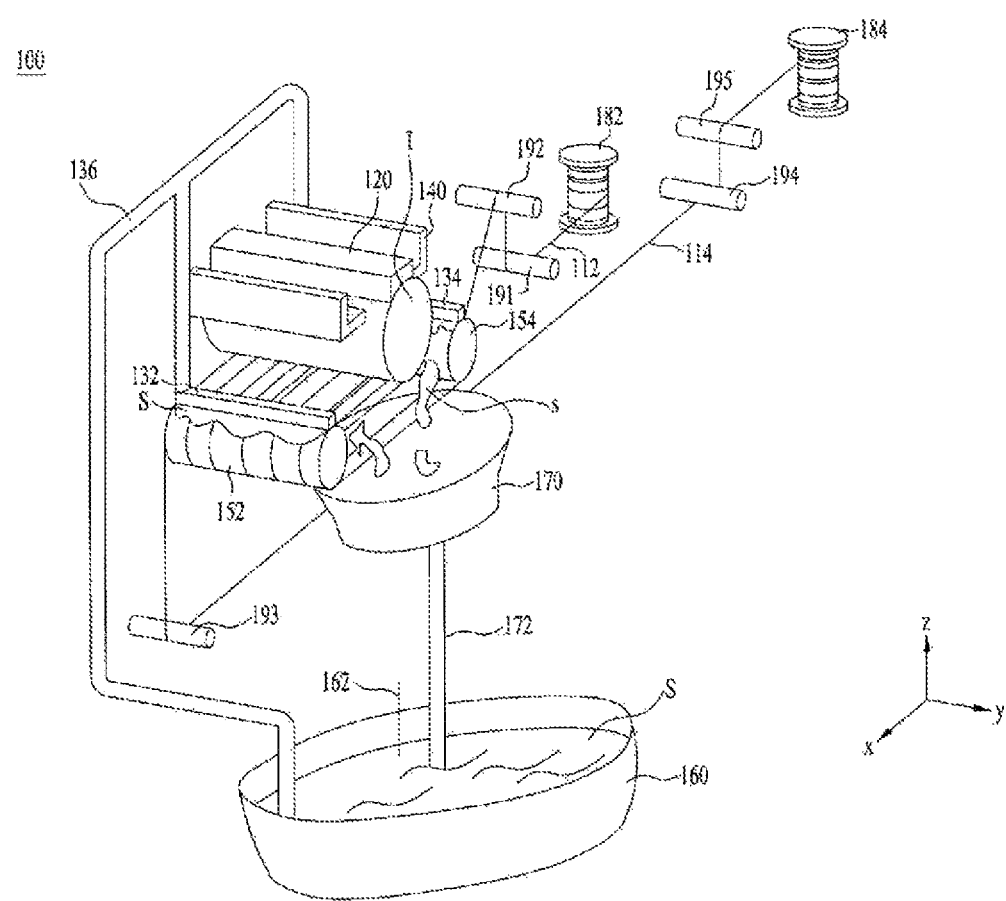
FIG. 1 illustrates a perspective view of a wire sawing apparatus according to one embodiment.

FIG. 1 illustrates a perspective view of a wire sawing apparatus 100 according to one embodiment.

Referring to FIG. 1, the wire sawing apparatus 100 according to the embodiment may include wires 112 and 114 or W (in FIG. 1, "112" and "114" correspond to "W"), an ingot conveyor unit 120, nozzles 132 and 134, pipes 136 and 172, a dispersed slurry (S) blocking unit 140, wire rollers 152 and 154, a slurry tank 160, an agitator 162, a slurry bath 170, first and second bobbins 182 and 184, and pulleys 191, 192, 193, 194 and 195.

An ingot I may be cut into a wafer form by the wire W. The wire W or 112 and 114 may be formed of carbon steel.

The ingot conveyor unit 120 serves to convey the ingot I toward the wire W.

Figure 2:
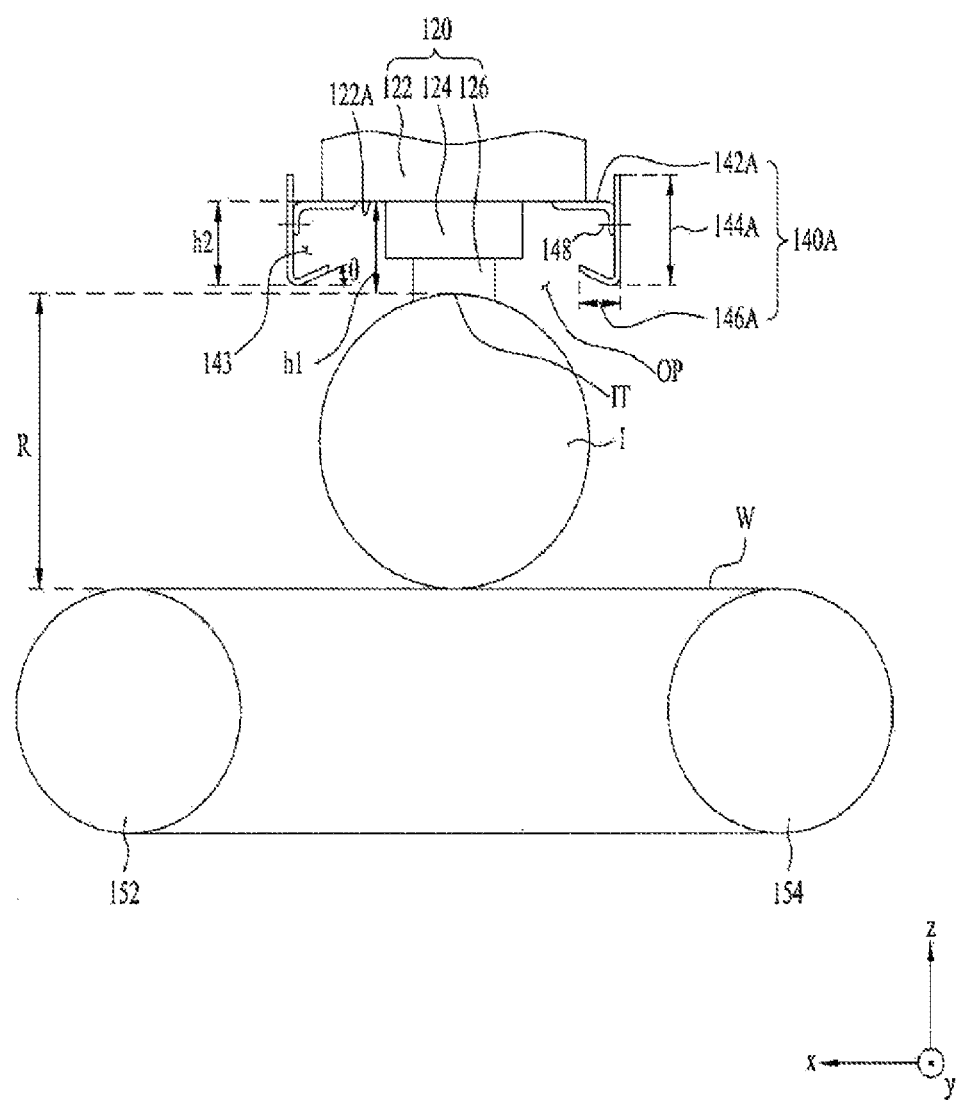
FIG. 2 is a cross-sectional view for explaining one embodiment of each of an ingot conveyor unit and a dispersed slurry blocking unit illustrated in FIG. 1.

FIG. 2 is a cross-sectional view for explaining one embodiment of each of the ingot conveyor unit 120 and the dispersed slurry blocking unit 140 illustrated in FIG. 1.

Referring to FIG. 2, the ingot conveyor unit 120 may include a feed table 122, a holder 124, and a beam element 126.

The feed table 122 may lower the ingot I toward the wire W. The feed table 122 serves to apply pressure to the holder 124 so as to convey the ingot I toward the wire W. That is, the feed table 122 may lower the ingot I toward the wire W so that the entire diameter R of the ingot I may be wholly sawn.

The holder 124 serves to fix the ingot I to the feed table 122. For example, with a tong-type fixing manner, the feed table 122 may serve as tongs, and the holder 124 may be a part to be gripped by the tongs. For example, although the material of the holder 124 may be $CaCO_3$, embodiments are not limited as to the material of the holder 124.

The beam element 126 serves to connect the holder 124 and the ingot I to each other.

Referring again to FIG. 1, the nozzles 132 and 134 serve to supply slurry S to the wire W. To this end, the nozzles 132 and 134 may be installed near the wire rollers 152 and 154 and the wire W.

For example, the slurry S stored in the slurry tank 160 is supplied to the respective nozzles 132 and 134 through the pipe 136, and the nozzles 132 and 134 serve to spray the supplied slurry S toward the wire W.

The wire rollers 152 and 154 have grooves, which allow the wire W to be wound therearound and guide the wire W, and serve to rotate the wire W. The wire rollers 152 and 154 may be realized by applying a polyurethane resin around a steel-made cylinder and forming grooves in the surface thereof at a constant pitch.

The slurry tank 160 serves to accommodate the slurry S to be supplied to the nozzles 132 and 134. The agitator 162 serves to stir the slurry S accommodated in the slurry tank 160 so as to prevent the slurry S from solidifying.

The slurry bath 170 serves to accommodate the slurry S, which has been outletted from the nozzles 132 and 134 and used when sawing the ingot I. Although the slurry S accommodated in the slurry bath 170 may be recycled by being accommodated in the slurry tank 160 through the pipe 172, embodiments are not limited thereto.

The first bobbin 182 serves to wind the new wire 112, which is used to saw the ingot I, and the second bobbin 184 serves to wind the old wire 114, which has sawn the ingot I.

The pulleys 191 to 195 serve to change the path along which the wires 112 and 114 move.

Meanwhile, the dispersed slurry blocking unit 140 may be disposed on the lateral side of the ingot I to be sawn by the wire W, and may absorb at least some of the slurry dispersed from the lateral surface of the ingot I, which is cut by the wire W. To this end, the dispersed slurry blocking unit 140 may have a mesh structure in order to absorb the dispersed slurry S.

The dispersed slurry blocking unit 140 may also be applied to a wire sawing apparatus having a structure different from that of the wire sawing apparatus 100 illustrated in FIG. 1. That is, the dispersed slurry blocking unit 140 according to the embodiment may also be applied to a wire sawing apparatus having any other structure in which the slurry S is supplied to the wire W and the ingot I is sawn by the wire W.

Figure 3:
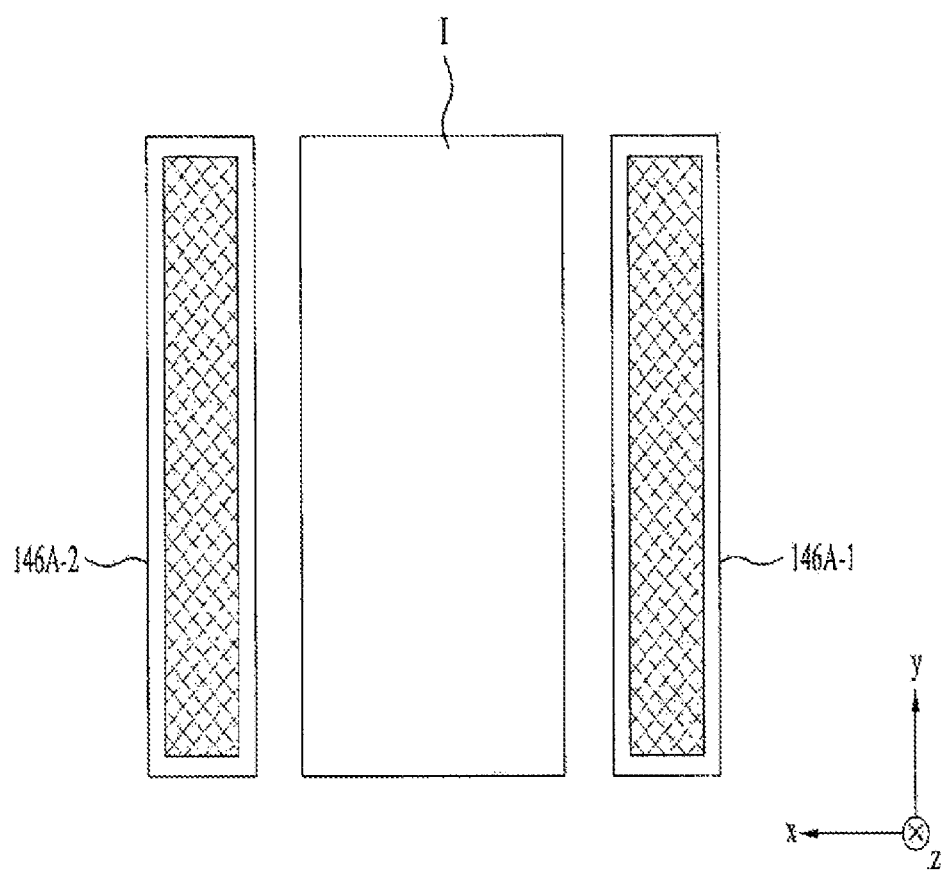
FIG. 3 illustrates a bottom view of an ingot and only a lower portion of a dispersed slurry blocking unit illustrated in FIG. 2.

FIG. 3 illustrates a bottom view of the ingot I and only a lower portion 146A of a dispersed slurry blocking unit 140A illustrated in FIG. 2.

Referring to FIG. 3, it can be seen that first and second lower portions 146A-1 and 146A-2 of the dispersed slurry blocking units 140 and 140A illustrated in FIGS. 1 and 2 have a mesh form. Here, the first lower portion 146A-1 corresponds to the lower portion of the dispersed slurry blocking unit 140 or 140A, which is disposed on the left side of the ingot I illustrated in FIG. 1 or 2, and the second lower portion 146A-2 corresponds to the lower portion of the dispersed slurry blocking unit 140 or 140A, which is disposed on the right side of the ingot I illustrated in FIG. 1 or 2.

In addition, the dispersed slurry blocking unit 140 or 140A illustrated in FIG. 1 or 2 may be disposed in the longitudinal direction (e.g., the y-direction) of the ingot I. This is because the slurry S is dispersed in the longitudinal direction of the ingot I while the wire W saws the ingot I.

Referring again to FIG. 2, the dispersed slurry blocking unit 140A may include an upper portion 142A, a lateral portion 144A, and the lower portion 146A.

The upper portion 142A of the dispersed slurry blocking unit 140A may be attached to a support surface 122A, which supports the ingot conveyor unit 120. In the case of FIG. 2, although the support surface to which the upper portion 142A is attached is illustrated as being the bottom surface 122A of the feed table 122, embodiments are not limited thereto. That is, the upper portion 142A may be attached to any structure other than the feed table 122.

The lateral portion 144A of the dispersed slurry blocking unit 140A is located between the upper portion 142A and the lower portion 146A. Here, as illustrated in FIG. 2, when the upper portion 142A and the lateral portion 144A are divided so as to be separate from each other, the upper portion 142A and the lateral portion 144A may be screwed together by a connection member 148 such as a screw. In addition, the lower portion 146A and the lateral portion 144A may be separately formed, as the upper portion 142A and the lateral portion 144A are separately formed, or may be integrally formed with each other, as illustrated in FIG. 2.

In addition, the dispersed slurry blocking unit 140A may include a slurry accommodation space 143 in which the dispersed slurry S is stored. The slurry accommodation space 143 may be defined by the upper portion 142A, the lateral portion 144A, and the lower portion 146A.

In addition, the lower portion 146A of the dispersed slurry blocking unit 140A may be spaced apart from the ingot I so that an opening OP is present to allow the dispersed slurry S to be introduced into the slurry accommodation space 143. That is, the opening OP must necessarily be provided in order to allow the dispersed slurry to be introduced into the slurry accommodation space 143.

In addition, the lower portion 146A of the dispersed slurry blocking unit 140A may include at least one mesh plate, which absorbs the dispersed slurry S. That is, the mesh structure that absorbs the dispersed slurry S may be realized in a plate form.

Figure 4:
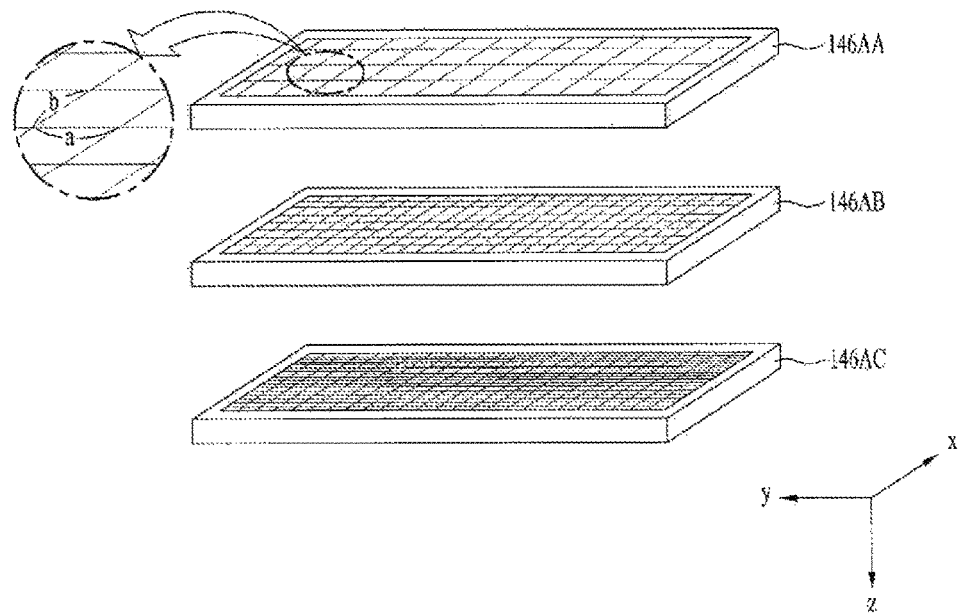
FIG. 4 illustrates an exemplary exploded perspective view of the lower portion of the dispersed slurry blocking unit illustrated in FIG. 2.

FIG. 4 illustrates an exemplary exploded perspective view of the lower portion 146A of the dispersed slurry blocking unit 140A illustrated in FIG. 2.

Although not illustrated in FIG. 2, the lower portion 146A of the dispersed slurry blocking unit 140A may include first to third mesh plates 146AA, 146AB, and 146AC, as illustrated in FIG. 4. Here, in the case of FIG. 4, although only the first to third mesh plates 146AA, 146AB, and 146AC are illustrated, embodiments are not limited thereto. That is, according to another embodiment, the lower portion 146A of the dispersed slurry blocking unit 140A may include two, or four or more, mesh plates.

The first to third mesh plates 146AA, 146AB and 146AC may be disposed with being stacked one above another in the vertical direction, i.e. in the z-direction, in which the ingot conveyor unit 120 conveys the ingot I to the wire W.

In the case of FIG. 4, although each of the first to third mesh plates 146AA, 146AB, and 146AC is illustrated as having a mesh structure, embodiments are not limited thereto. That is, according to another embodiment, only some of the first to third mesh plates 146AA, 146AB, and 146AC may have a mesh structure.

In addition, in each of the first to third mesh plates 146AA, 146AB, and 146AC, the size of respective openings in the mesh may be reduced with increasing distance from the wire W. For example, when the y-axis length of the opening in the mesh is "a" and the x-axis length of the opening in the mesh is "b", the size ab of the openings in the mesh may be reduced as the distance between the mesh plates 146AA, 146AB, and 146AC and the wire W increases.

Comparing FIGS. 2 and 4 with each other based on a Cartesian coordinate system, the first mesh plate 146AA is located closer to the wire W than the second mesh plate 146B, and the second mesh plate 146AB is located closer to the wire W than the third mesh plate 146AC. Accordingly, the size of the opening in the third mesh plate 146AC, which is located farthest from the wire W, may be smaller than the size of the opening in each of the first and second mesh plates 146AA and 146AB. In addition, the size of the opening in the second mesh plate 146AB may be smaller than the size of the opening in the first mesh plate 146AA.

Figure 5:
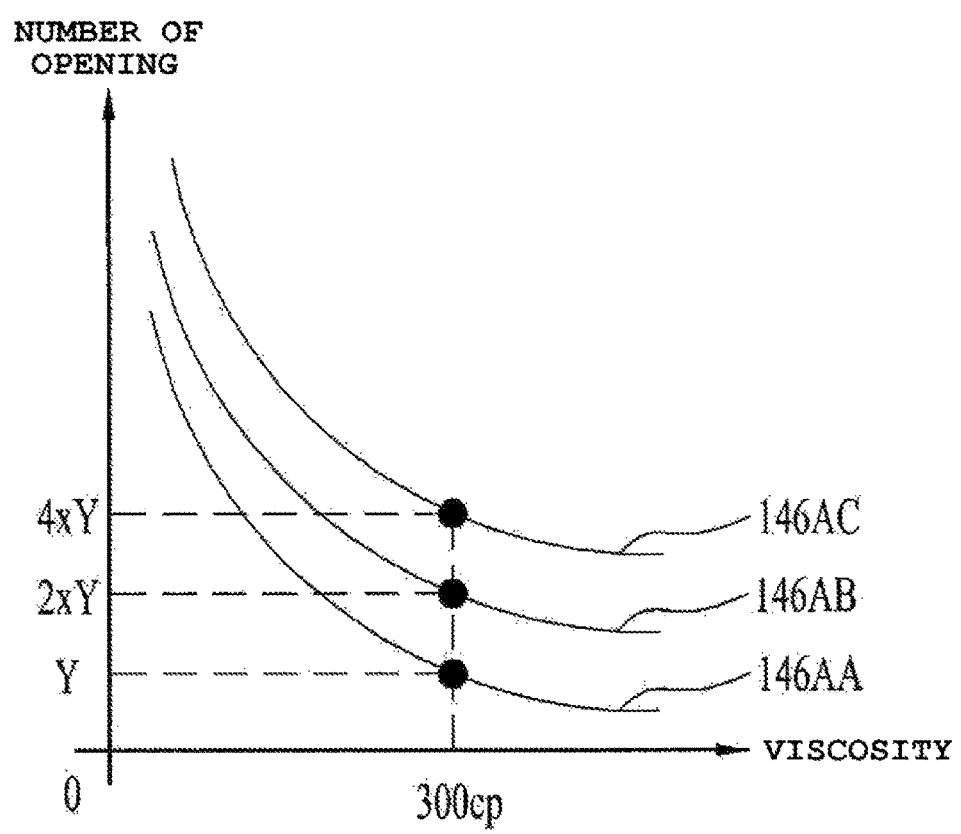
FIG. 5 is a graph for explaining the number of openings for each inch in each of multiple mesh plates depending on the viscosity of slurry.

FIG. 5 is a graph for explaining the number of openings for each inch in each of the multiple mesh plates depending on the viscosity of slurry. The horizontal axis represents the viscosity of slurry and the vertical axis represents the number of openings.

The more the size of the openings is small, the more the number of openings included in a given area increases. That is, referring to FIG. 5, when the viscosity of slurry is 300 centipoise (cP), the number of openings included in a unit square inch may be Y in the first mesh plate 146AA, 2Y in the second mesh plate 146AB, and 4Y in the third mesh plate 146AC. Here, Y may be 35.

As described above, the reason why the size of the openings in the mesh plate is reduced with increasing distance from the wire W is to allow the first to third mesh plates 146AA, 146AB, and 146AC to more efficiently absorb the slurry because the force by which the slurry is dispersed becomes stronger with decreasing distance to the wire W and the force by which the slurry is dispersed becomes weaker with increasing distance to the wire W.

In addition, referring again to FIG. 2, the lower portion 146A of the dispersed slurry blocking unit 140A may have an inclined shape in the inward direction toward the ingot I. As such, the lower portion 146A of the dispersed slurry blocking unit 140A is inclined in the inward direction. That is, the lower portion 146A is tapered in the +x-direction. When the lower portion 146A of the dispersed slurry blocking unit 140A has an inclined shape as described above, the dispersed slurry may be efficiently blocked by the dispersed slurry blocking unit 140A.

In addition, the bottom of the dispersed slurry blocking unit 140A, i.e. the lowermost portion thereof, may be located higher than the position of the wire W. This serves to prevent the dispersed slurry blocking unit 140A from coming into contact with and being cut by the wire W when the wire W saws the top IT of the ingot I.

In addition, the dispersed slurry blocking unit 140 illustrated in FIG. 1 may have an attachable/detachable shape. Thereby, the slurry, which remains in the mesh structure of the dispersed slurry blocking unit 140, may be easily removed.

Figure 6:
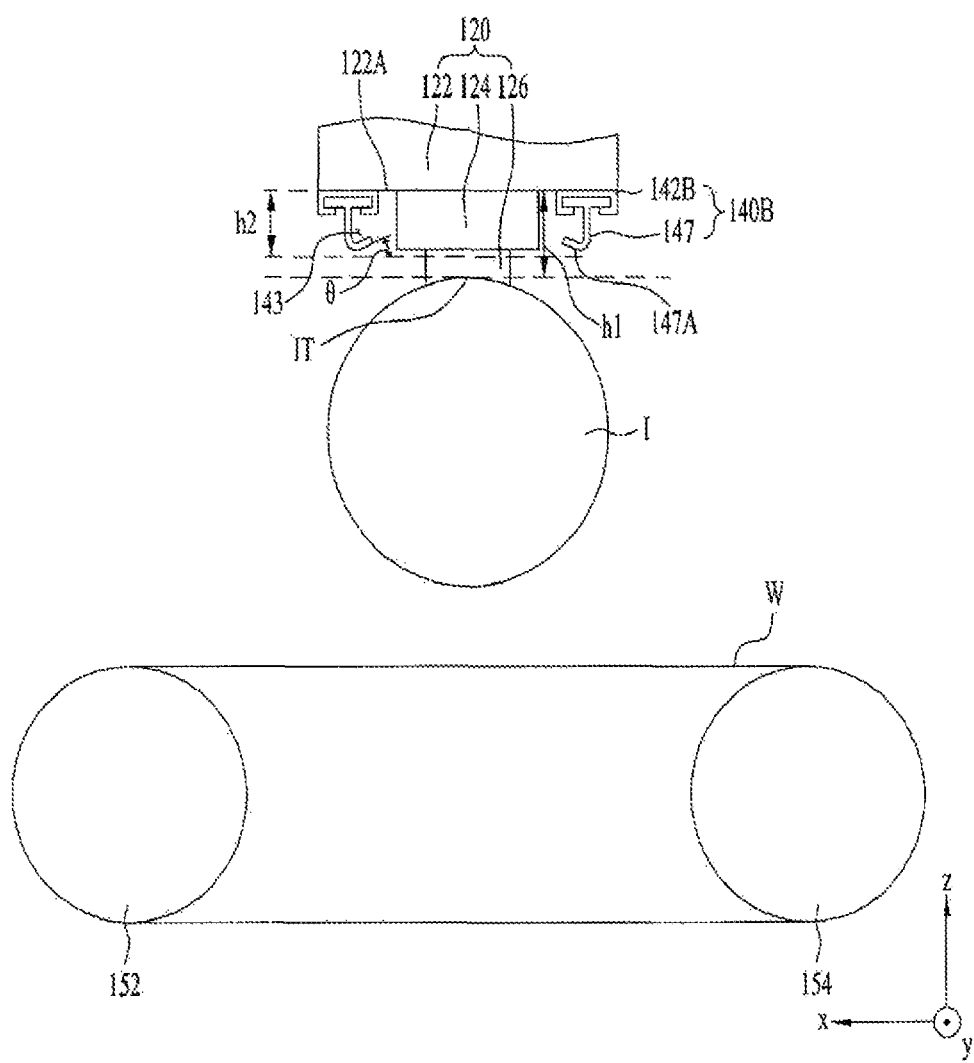
FIG. 6 illustrates a cross-sectional view for explaining another embodiment of the dispersed slurry blocking unit illustrated in FIG. 1.

FIG. 6 illustrates a cross-sectional view for explaining another embodiment 140B of the dispersed slurry blocking unit 140 illustrated in FIG. 1.

An upper portion 142B of the dispersed slurry blocking unit 140B illustrated in FIG. 6 may be fixed to the support surface 122A. Here, although the lateral portion and the lower portion of the dispersed slurry blocking unit 140B may be integrally formed (hereinafter, referred to as an integrated portion 147) and may be shaped so as to be attachable to or detachable from the upper portion 142B, embodiments are not limited thereto.

According to another embodiment, unlike the illustration of FIG. 6, the lateral portion and the lower portion of the dispersed slurry blocking unit 140B may be separated from each other, and may be connected to each other by the connection member 148 in the same manner as illustrated in FIG. 2.

Figure 7:
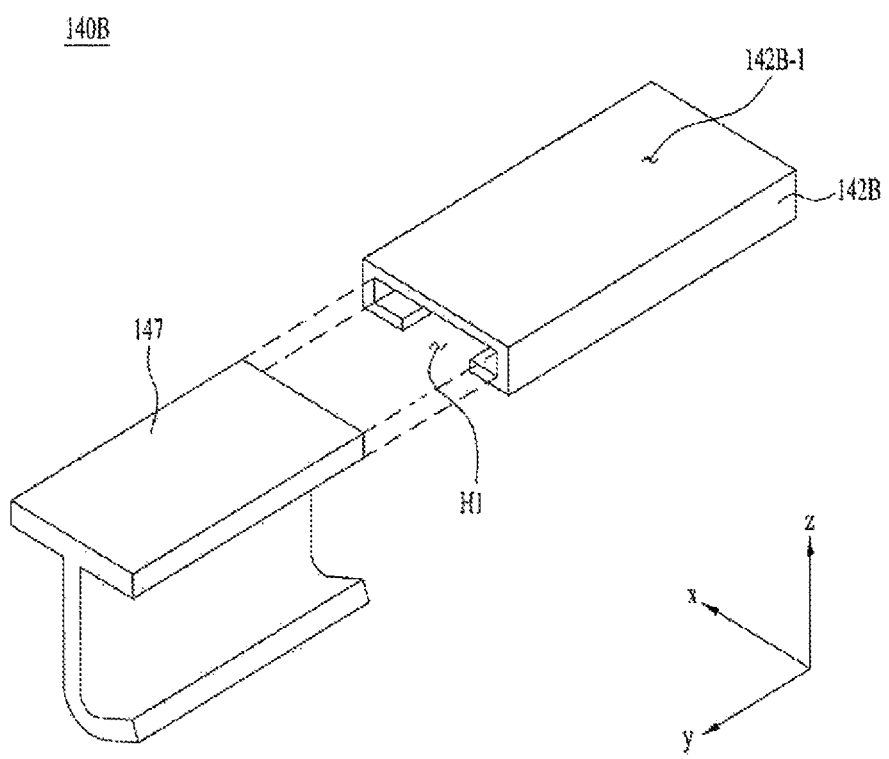
FIG. 7 illustrates an exploded perspective view of the dispersed slurry blocking unit illustrated in FIG. 6.

FIG. 7 illustrates an exploded perspective view of the dispersed slurry blocking unit 140B illustrated in FIG. 6.

Referring to FIG. 7, a top surface 142B-1 of the upper portion 142B may be attached to the support surface 122A, and the integrated portion 147 may be attachable to or detachable from the upper portion 142B. To this end, the upper portion 142B may have a recess portion H1, which has a shape suitable for insertion or separation of the integrated portion 147. The integrated portion 147 may be inserted into the recess portion H1 to thereby be attached to the upper portion 142B, and may be separated from the recess portion H1 to thereby be detached from the upper portion 142B.

As described above, the dispersed slurry blocking unit 140B has the same characteristics as the dispersed slurry blocking unit 140A illustrated in FIG. 2, with the exception that the dispersed slurry blocking unit 140B has an attachable/detachable shape, unlike the dispersed slurry blocking unit 140A. That is, the lower portion of the dispersed slurry blocking unit 140B may have a mesh structure. In addition, the dispersed slurry blocking unit 140B may include multiple mesh plates, as illustrated in FIG. 4, and may have an inwardly inclined shape. Thus, a repeated description of the dispersed slurry blocking unit 140B will be omitted.

Accordingly, the features of the dispersed slurry blocking unit 140B illustrated in FIGS. 6 and 7 are identical to the features of the dispersed slurry blocking unit 140A illustrated in FIG. 2.

Figure 8:
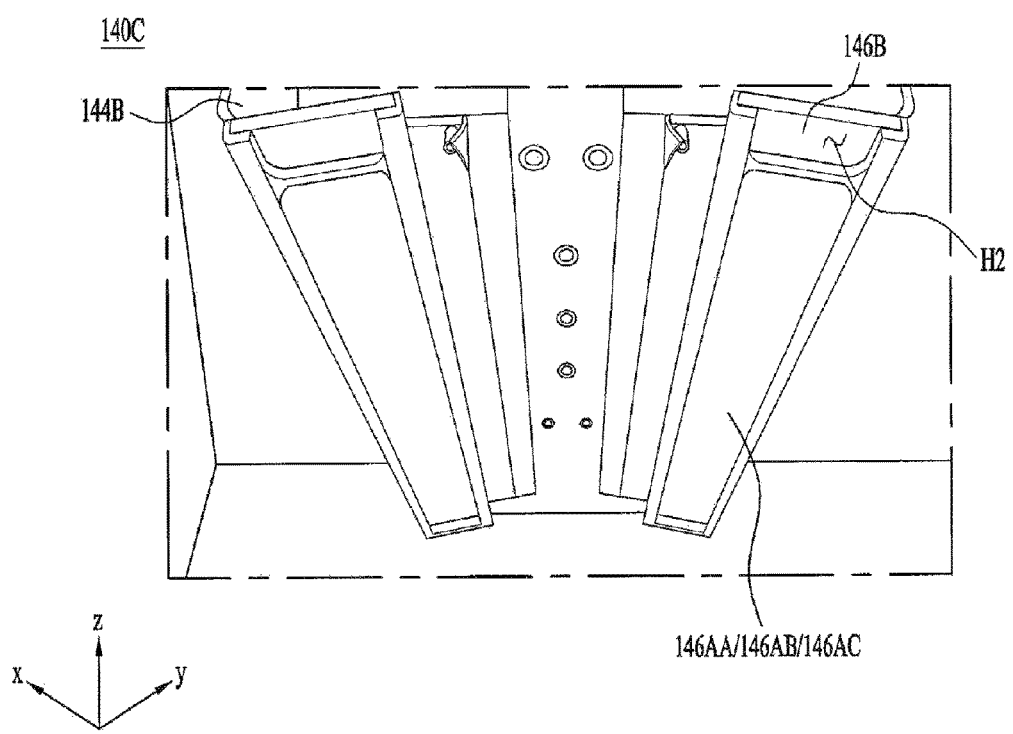
FIG. 8 illustrates a photograph of a still another embodiment of the dispersed slurry blocking unit illustrated in FIG. 1.

FIG. 8 illustrates a photograph of a still another embodiment 140C of the dispersed slurry blocking unit 140 illustrated in FIG. 1.

Referring to FIG. 8, the dispersed slurry blocking unit 140C may include the upper portion 142A (not illustrated in FIG. 8) illustrated in FIG. 2, a lower portion 146B, which may be integrally formed with the lateral portion 144B, and a lateral portion 144B, which may be coupled to the upper portion 142A as illustrated in FIG. 2. Here, it can be seen that the multiple mesh plates 146AA, 146AB, and 146AC illustrated in FIG. are attached to the lower portion 146B. As illustrated in FIG. 7, like the manner in which the integrated portion 147 is shaped so as to be attachable to or detachable from the upper portion 142B, the multiple mesh plates 146AA, 146AB, and 146AC illustrated in FIG. 8 may be shaped so as to be attachable to or detachable from the lower portion 146B.

As described above, the dispersed slurry blocking unit 140C illustrated in FIG. 8 is identical to the dispersed slurry blocking unit 140A illustrated in FIG. 2, excluding the difference in the attachable/detachable portion. Therefore, the features of the dispersed slurry blocking unit 140C illustrated in FIG. 8 are identical to the features of the dispersed slurry blocking unit 140A illustrated in FIG. 2.

Meanwhile, referring to FIGS. 1 to 3 and FIGS. 6 and 8, the dispersed slurry blocking unit 140, 140A, 140B or 140C may be disposed on each of the side that the wire W enters and the side that the wire W exits. When the wire W moves in the +x-direction, the left side of the ingot I corresponds to the side that the wire W enters, and the right side of the ingot I corresponds to the side that the wire W exits.

Conversely, when the wire W moves in the −x-direction, the right side of the ingot I corresponds to the side that the wire W enters, and the left side of the ingot I corresponds to the side that the wire W exits.

The wire W may be reciprocally moved by a motor (not illustrated) in the +x-direction and in the −x-direction in order to saw the ingot I. As such, the dispersed slurry blocking unit 140, 140A, 140B or 140C may be disposed on each of the left and right sides of the ingot I. However, embodiments are not limited thereto. That is, according to another embodiment, the dispersed slurry blocking unit 140, 140A, 140B or 140C may be disposed only on the left side or the right side of the ingot I, unlike the illustrations of FIGS. 1 to 3 and FIGS. 6 and 8.

Figure 9:
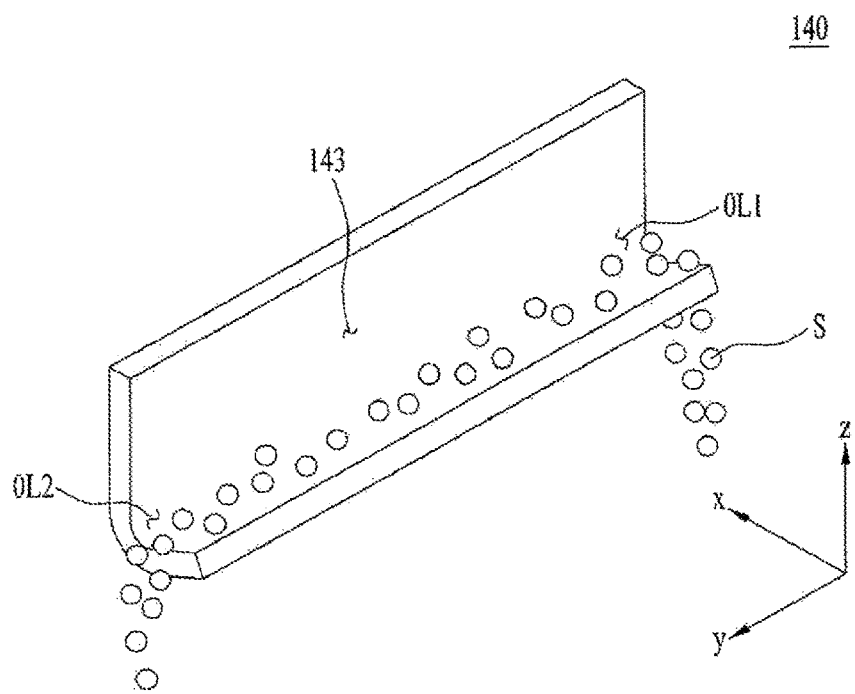
FIG. 9 illustrates a perspective view of the dispersed slurry blocking unit illustrated in FIG. 1.

FIG. 9 illustrates a perspective view of the dispersed slurry blocking unit 140 illustrated in FIG. 1.

Referring to FIG. 9, the dispersed slurry blocking unit 140 may include outlet ports OL1 and OL2. Here, the respective outlet ports OL1 and OL2 may discharge the slurry S stored in the slurry accommodation space 143 in the direction (e.g., the y-direction) perpendicular to the direction in which the wire W moves (e.g., the x-direction). That is, the dispersed slurry introduced into the slurry accommodation space 143 may fall to the slurry bath 170 through the outlet ports OL1 and OL2.

Hereinafter, the features of the wire sawing apparatus 100 according to the embodiment having the above-described configuration will be described with reference to the accompanying drawings.

Figure 10:
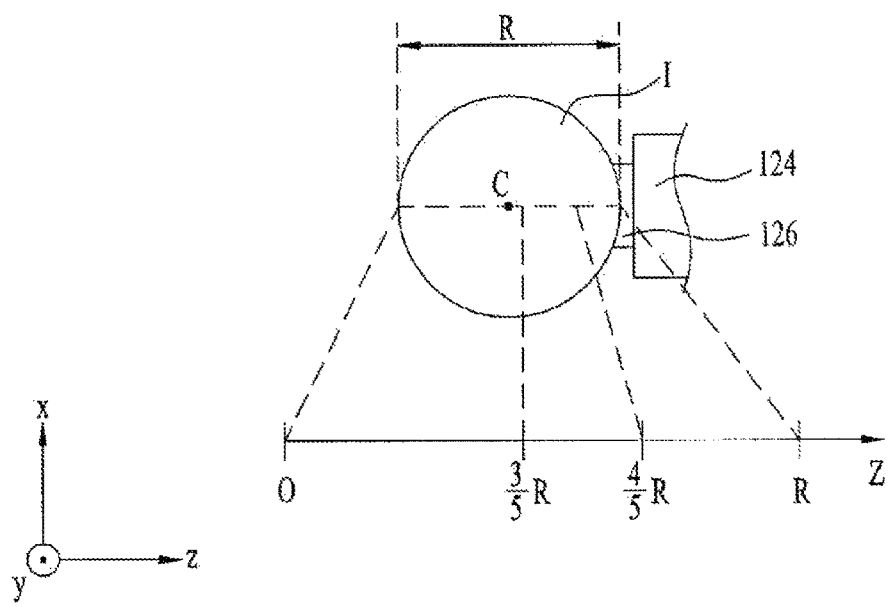
FIG. 10 illustrates a cross-sectional view of the ingot to be sawn by a wire and the ingot conveyor unit.

FIG. 10 illustrates a cross-sectional view of the ingot I to be sawn by the wire W and the ingot conveyor unit 120. Here, "R" designates the diameter of the cut plane of the ingot I, which is cut by sawing.

Figure 11A:
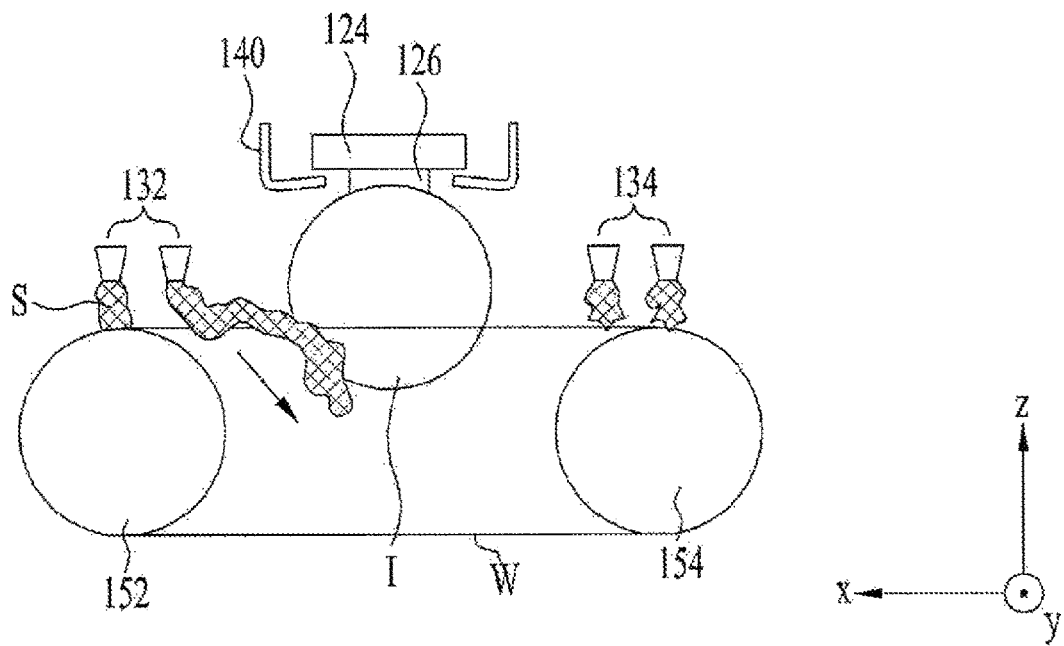
FIGS. 11a to 11c illustrate the dispersion of slurry as the sawing portion of the ingot increases.
Figure 11B:
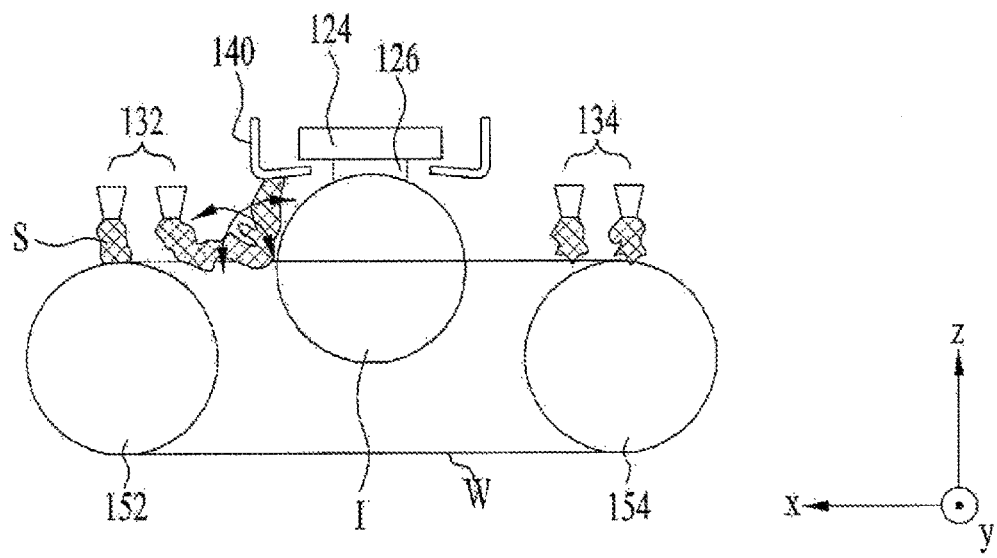
Figure 11C:
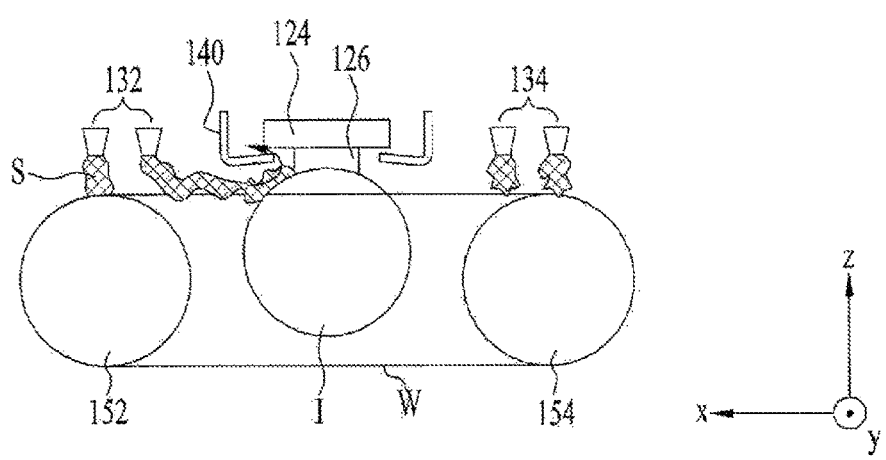

FIGS. 11a to 11c illustrate the dispersion of the slurry S as the sawn portion of the ingot I increases. That is, FIGS. 11a to 11c illustrate the spraying of the slurry S as the wire W gradually saws the ingot I in the +z-direction.

The ingot I, the holder 124, the beam element 126, the nozzles 132 and 134, and the wire rollers 152 and 154 illustrated in FIGS. 10 and 11a to 11c respectively correspond to the ingot I, the holder 124, the beam element 126, the nozzles 132 and 134, and the wire rollers 152 and 154 illustrated in FIGS. 1, 2 and 6, and thus a repeated description thereof will be omitted. In addition, the dispersed slurry blocking unit 140 illustrated in FIGS. 10 and 11a to 11c corresponds to the dispersed slurry blocking unit 140, 140A, 140B or 140C illustrated in FIGS. 1 to 3 and FIGS. 6 and 8, and thus a repeated description thereof will be omitted.

Referring to FIG. 10, until the ingot I is sawn less than 3R/5 in the +z-direction by the wire W, the slurry S between the wire W and the ingot I falls free, as illustrated in FIG. 11a, thereby being directed to the slurry bath 170, as indicated by the arrow, rather than being directed to the dispersed slurry blocking unit 140.

In succession, until the ingot I is sawn in the +z-direction from the point of 3R/5 to the point of 4R/5 by the wire W, the slurry S between the wire W and the ingot I is dispersed in the directions indicated by the arrows due to the circular shape of the ingot I, as illustrated in FIG. 11b. At this time, the dispersed slurry blocking unit 140 according to the embodiment may absorb the slurry S that is dispersed upward by the mesh structure, and the remaining slurry falls free to thereby be directed to the slurry bath 170.

In succession, until the ingot I is sawn beyond 4R/5 position among the entire diameter R of the ingot I to the top IT of the ingot I by the wire W, the slurry S between the wire W and the ingot I is dispersed in the direction indicated by the arrow, as illustrated in FIG. 11c. At this time, the slurry S that is dispersed upward collides with the ingot conveyor unit 120, and is then introduced into the slurry accommodation space 143 through the opening OP, thereby being stored therein. In particular, when the rear portion of the ingot I beyond 4R/5 position among the entire diameter R of the ingot I is sawn, the eddy of the slurry S is the most severe, as illustrated in FIG. 11c. At this time, when the lower portion of the dispersed slurry blocking unit 140, 140A, 140B, or 140C is inclined in the inward direction, the dispersed slurry S may be introduced through the opening OP to thereby be stored in the slurry accommodation space 143. Thereby, it is possible to prevent the dispersed slurry from being re-introduced to the wire W and the ingot I. At this time, in order to secure the opening OP, referring to FIG. 2, the distance between the bottom of the lower portion 146A and the top IT of the ingot I may range from 1 cm to 2 cm. That is, a first height h1 from the bottom surface 122A of the feed table 122 to the top IT of the ingot I may be greater by 1 cm to 2 cm than a second height h2 from the bottom surface 122A of the feed table 122 to the bottom of the lower portion 146A of the dispersed slurry blocking unit 140A. In addition, the inclination angle θ of the lower portion 146A may range from 7° to 10°, for example, 7° to 8°. Of course, this also applies to the case of the dispersed slurry blocking unit 140B or 140C illustrated in FIG. 6 or 7.

Figure 12:
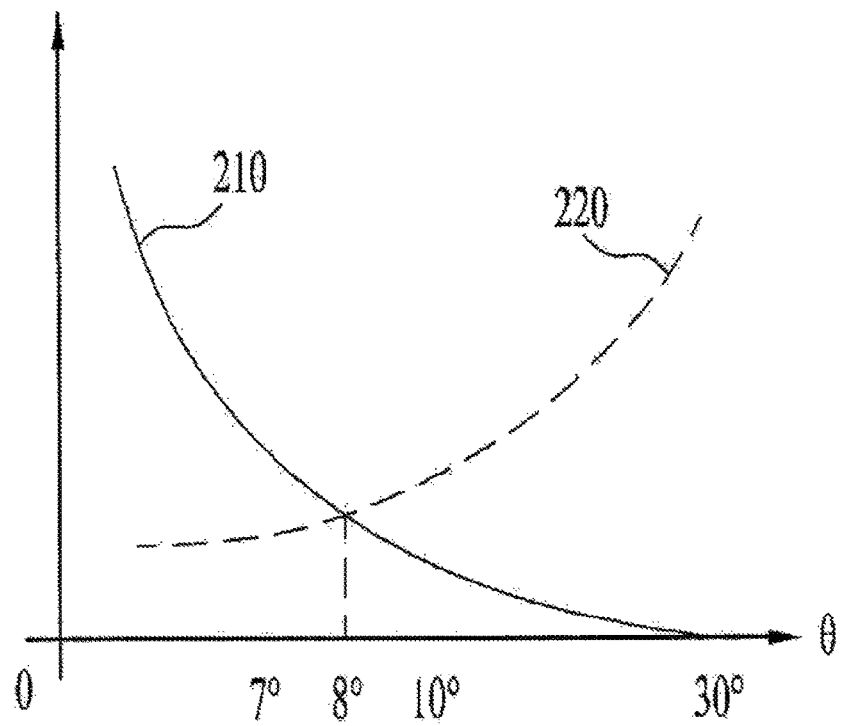
FIG. 12 is a graph illustrating the capability to collect slurry for each inclination angle.

FIG. 12 is a graph illustrating the capability to collect slurry for each inclination angle θ. The horizontal axis represents the inclination angle θ, and the vertical axis represents the capability to collect slurry.

Referring to FIGS. 2 and 12, it can be seen that the slurry storage capability 210 of the slurry accommodation space 143 is reduced as the inclination angle θ is increased, whereas the slurry absorption capability 220 of the mesh in the lower portion 146A of the dispersed slurry blocking unit 140A is increased as the inclination angle θ is increased. The amount of slurry absorbed by the mesh structure of the dispersed slurry blocking unit 140A may be small when the inclination angle θ is less than 7°, and the amount of slurry stored in the slurry accommodation space 143 may be reduced when the inclination angle θ is greater than 10°.

In consideration of this, the inclination angle θ may be set within the range from 7° to 10° in which the slurry storage capability 210 and the slurry absorption capability 220 become equal to each other.

Figure 13A:
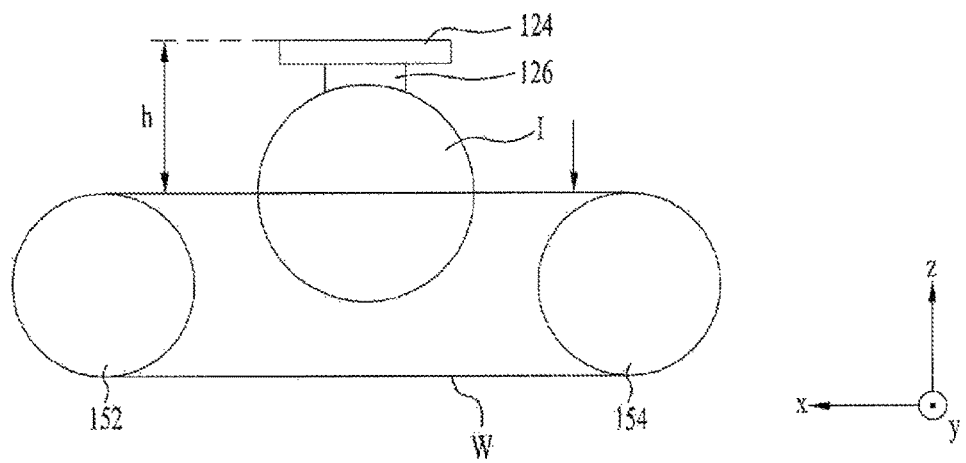
FIG. 13a illustrates a cross-sectional view of a wire sawing apparatus according to a first comparative example, which includes no dispersed slurry blocking unit.
Figure 13B:
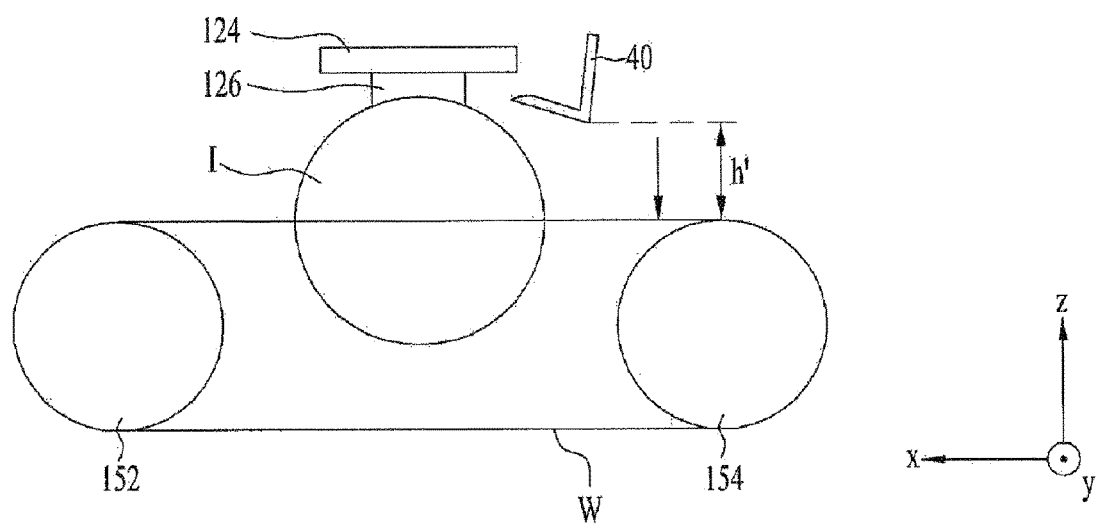
FIG. 13b illustrates a cross-sectional view of a wire sawing apparatus according to a second comparative example, which includes a dispersed slurry blocking unit having no mesh structure.
Figure 13C:
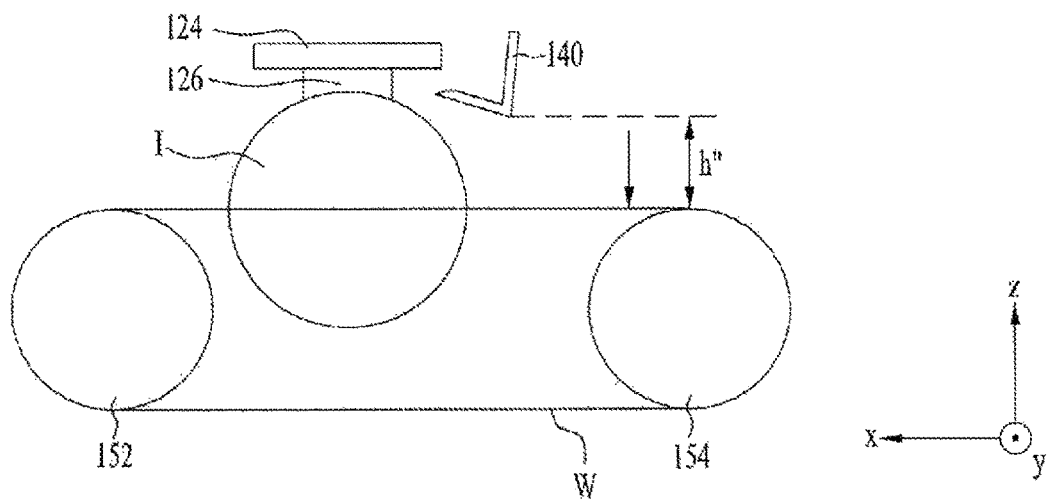
FIG. 13c illustrates a cross-sectional view of the wire sawing apparatus according to the embodiment, which includes the dispersed slurry blocking unit having a mesh structure.

FIG. 13a illustrates a cross-sectional view of a wire sawing apparatus according to a first comparative example, which includes no dispersed slurry blocking unit 140, FIG. 13b illustrates a cross-sectional view of a wire sawing apparatus according to a second comparative example, which includes a dispersed slurry blocking unit 40 having no mesh structure, and FIG. 13c illustrates a cross-sectional view of the wire sawing apparatus 100 according to the embodiment, which includes the dispersed slurry blocking unit 140 having a mesh structure.

The holder 124, the beam element 126, and the feed rollers 152 and 154 in FIGS. 13a to 13c are identical to those illustrated in FIG. 2. In particular, the dispersed slurry blocking unit 140 illustrated in FIG. 13c may be the dispersed slurry blocking unit 140A, 140B or 140C illustrated in FIG. 2, 6 or 8.

In FIG. 13a, h designates the height from the wire W to the top of the holder 124. In FIG. 13b, h' designates the height from the wire W to the bottom of the dispersed slurry blocking unit 40. In addition, h" designates the height from the wire W to the bottom of the dispersed slurry blocking unit 140.

In the case of the wire sawing apparatus according to the first comparative example illustrated in FIG. 13a, the dispersed slurry falls to the wire W and the ingot I, causing vibration or tensile deformation of the wire W, which may result in the warpage of a wafer or deterioration in total thickness variation (TTL).

In addition, when the wire sawing apparatus according to the second comparative example illustrated in FIG. 13b includes the dispersed slurry blocking unit 40, but the dispersed slurry blocking unit 40 has no mesh structure, although the magnitude of shock due to the dispersed slurry may be reduced owing to the reduced height h', the improvement is minimal.

However, when the dispersed slurry blocking unit 140 has a mesh structure as in the wire sawing apparatus 100 according to the embodiment illustrated in FIG. 13c, the quantity of movement of the dispersed slurry S is greatly reduced by the mesh structure.

This is because the quantity of movement of the dispersed slurry S is reduced in proportion to the increase in the area over which the dispersed slurry S comes into contact with the dispersed slurry blocking unit 140. This is based on the same principle by which a breakwater is designed to have a block shape, rather than a planar shape. In addition, for example, since the specific gravity of the slurry S is within a high range, from 1.3 to 1.8, and the viscosity of the slurry S is within a high range, from 200 cP to 500 cP, when the contact area between the dispersed slurry and the dispersed slurry blocking unit 140 is increased by the mesh structure, the effect may be greater. In this way, when the lower portion of the dispersed slurry blocking unit 140 has a mesh structure, the dispersed slurry may be absorbed, rather than being reflected, which may effectively reduce the magnitude of shock caused when the slurry collides with the dispersed slurry blocking unit 140.

FIGS. 14 to 17 are graphs for comparing warpage in the wire sawing apparatuses according to the first and second comparative examples and the embodiment. In each graph, the horizontal axis represents the sawing position of the ingot I in the z-direction, the vertical axis represents warpage, and R designates the diameter of the entire ingot I.

Figure 14:
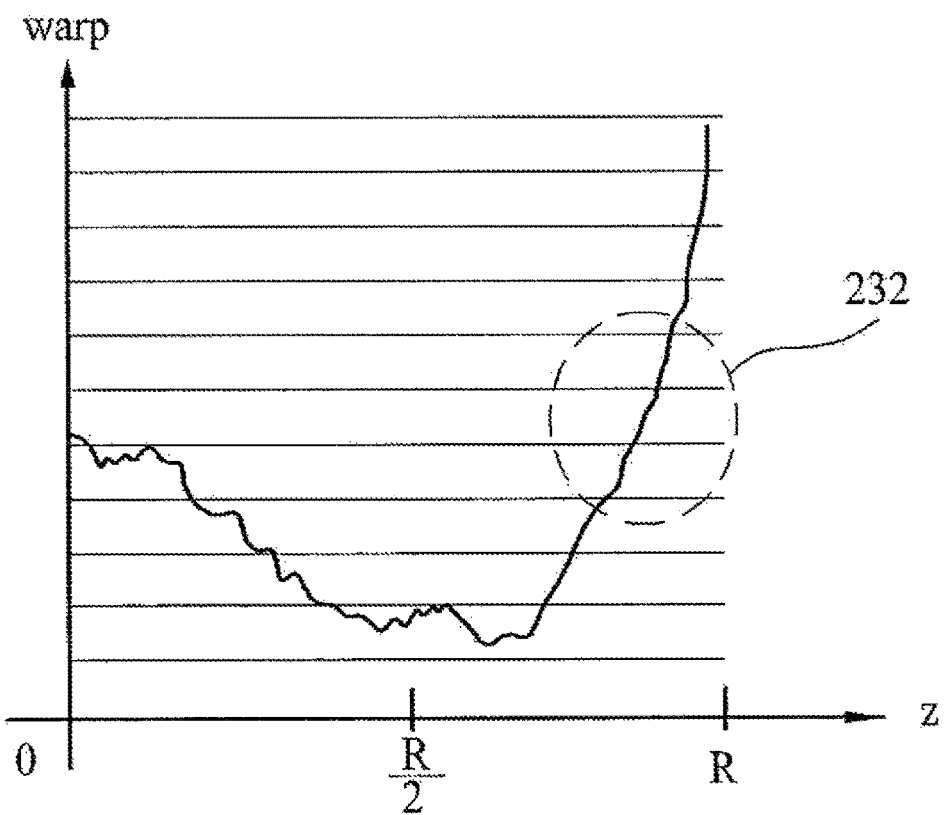
FIG. 14 is a graph illustrating warpage in the wire sawing apparatus according to the first comparative example.
Figure 15:
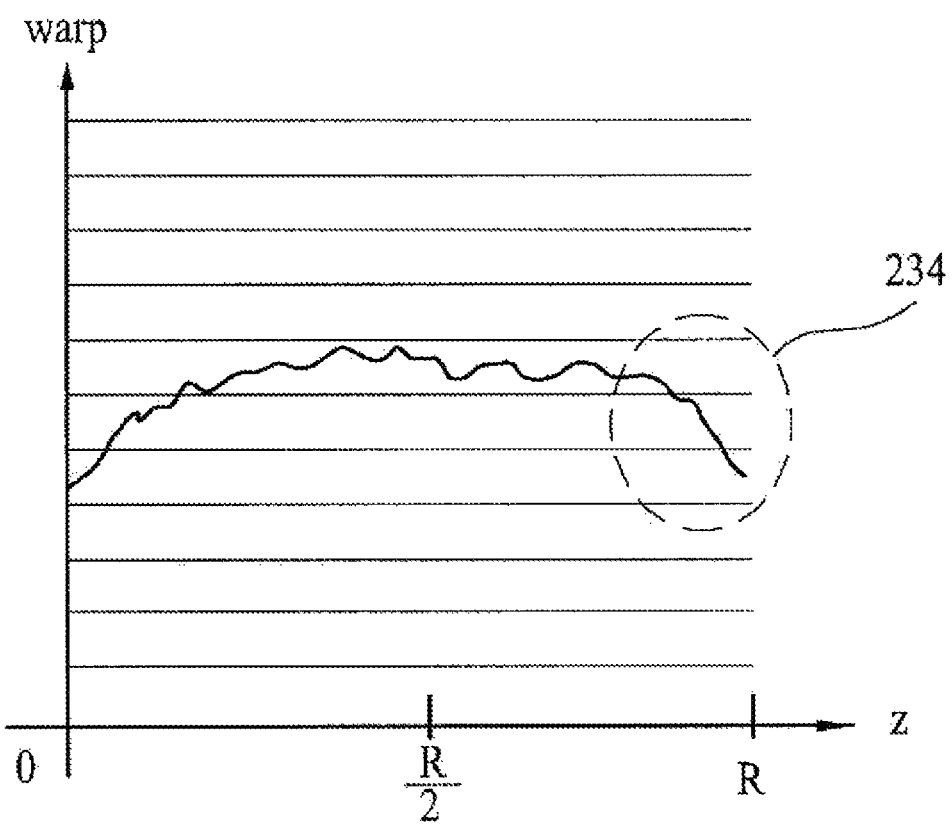
FIGS. 15 and 16 are graphs respectively illustrating warpage in the wire sawing apparatus according to the second comparative example.
Figure 16:
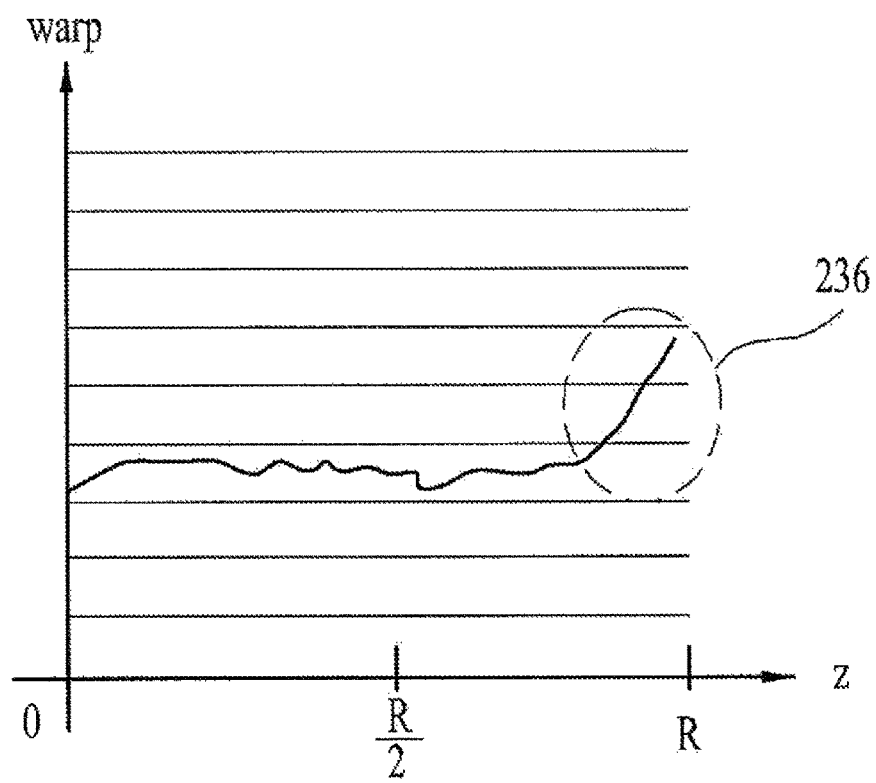

Referring to FIGS. 14 to 17, it can be seen that the wire sawing apparatus according to the first comparative example illustrated in FIG. 14 exhibits the largest warpage in a rear portion 232, in which the sawing position of the ingot I is 3R/5 or more position among the entire diameter R of the ingot I. In addition, it can be seen that, in the case of the second comparative example illustrated in FIG. 15 or 16 in which the inclination angle θ is within a range from 7° to 10°, but there is no mesh structure, although the warpage is improved in a rear portion 234 or 236 compared to the case of FIG. 14, variation still occurs.

Figure 17:
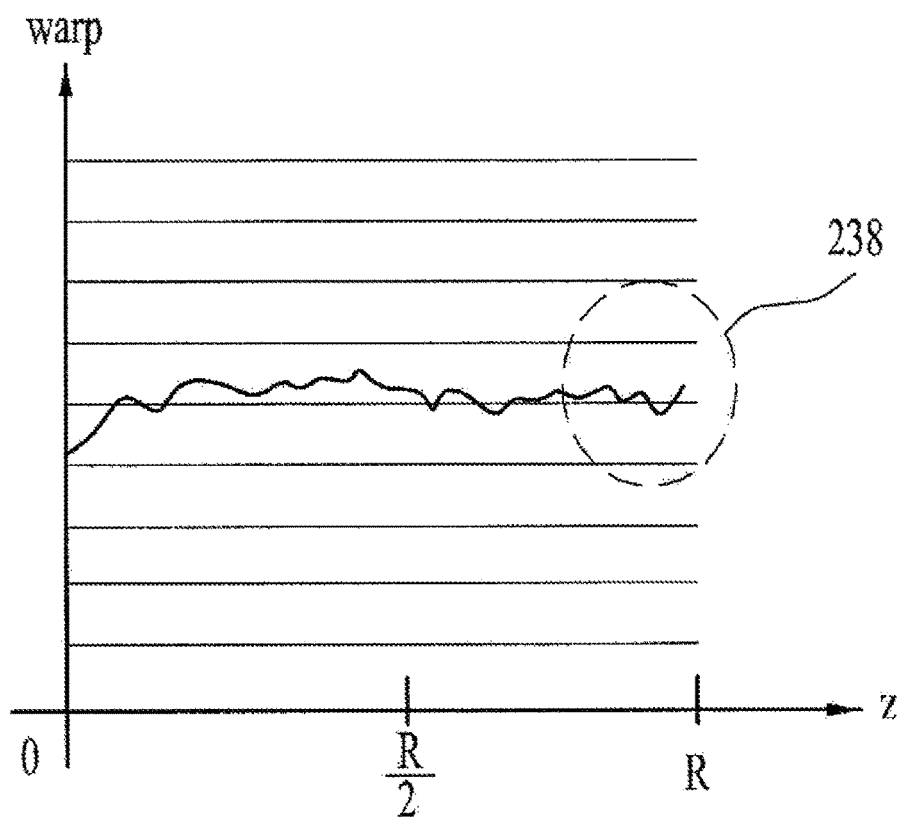
FIG. 17 is a graph illustrating warpage in the wire sawing apparatus according to the embodiment.

On the other hand, it can be seen that, in the case of the wire sawing apparatus according to the embodiment illustrated in FIG. 17 in which the inclination angle θ is within a range from 7° to 10° and a mesh structure is provided, warpage in a rear portion 238 is very stable. In conclusion, the wire sawing apparatus according to the embodiment may minimize overcooling of the ingot due to the re-introduction of the dispersed slurry, thereby reducing the warpage of a wafer.

Although the embodiments have been described above, the above description is merely illustrative and is not intended to limit the disclosure, and those skilled in the art will appreciate that various modifications and applications, which are not illustrated above, are possible without departing from the essential characteristics of the embodiments. For example, respective constituent elements, which are concretely illustrated in the embodiments, may be implemented in modified forms. In addition, differences associated with these modifications and applications should be construed as within the scope of the disclosure defined in the accompanying claims.

MODE FOR INVENTION

Various embodiments have sufficiently been described in the above-described "best mode" to implement the disclosure.

INDUSTRIAL APPLICABILITY

A wire sawing apparatus according to the embodiment may be used in an apparatus of manufacturing a wafer by sawing an ingot using a wire.

The invention claimed is:

1. A wire sawing apparatus, comprising:
a wire configured to cut an ingot;
an ingot conveyor unit configured to convey the ingot to the wire;
a nozzle configured to supply slurry to the wire; and
a dispersed slurry blocking unit disposed above and beside the ingot that is sawn by the wire and configured to absorb at least some of the slurry dispersed from a lateral surface of the ingot to be cut by the wire, the dispersed slurry blocking unit including a mesh structure that absorbs the dispersed slurry.

2. The wire sawing apparatus according to claim 1, wherein the dispersed slurry blocking unit comprises:
an upper portion attached to a support surface that supports the ingot conveyor unit; and
an integrated portion including at least one mesh plate configured to absorb the dispersed slurry, the integrated portion being shaped so as to be attachable to or detachable from the upper portion.

3. The wire sawing apparatus according to claim 1, wherein the dispersed slurry blocking unit comprises:
an upper portion attached to a support surface that supports the ingot conveyor unit;
a lower portion including at least one mesh plate configured to absorb the dispersed slurry; and
a lateral portion between the upper portion and the lower portion.

4. The wire sawing apparatus according to claim 3, wherein the upper portion and the lateral portion are screwed together, and the lower portion and the lateral portion are integrated.

5. The wire sawing apparatus according to claim 3, wherein the dispersed slurry blocking unit includes a slurry accommodation space defined by the upper portion, the lateral portion, and the lower portion and configured to store the dispersed slurry therein, and
wherein an opening is to be provided between the lower portion of the dispersed slurry blocking unit and the ingot to be cut, the opening being configured to allow introduction of the dispersed slurry into the slurry accommodation space.

6. The wire sawing apparatus according to claim 5, wherein the dispersed slurry blocking unit further includes an outlet port configured to discharge the dispersed slurry in the slurry accommodation space in a direction perpendicular to a direction in which the wire moves.

7. The wire sawing apparatus according to claim 3, wherein the lower portion is disposed such that a distance between a bottom of the lower portion and a top of the ingot to be cut ranges from 1 cm to 2 cm.

8. The wire sawing apparatus according to claim 3, wherein the at least one mesh plate includes a plurality of mesh plates stacked one above another, the plurality of mesh plates including a first mesh plate, a second mesh plate stacked on the first mesh plate and a third mesh plate stacked on the second mesh plate, the first mesh plate being closer to the wire than the second mesh plate, the second mesh plate being closer to the wire than the third mesh plate, and
wherein a size of openings in the first mesh plate is less than a size of openings in the second mesh plate, and the size of openings in the second mesh plate is less than a size of openings in the third mesh plate.

9. The wire sawing apparatus according to claim 8, where the mesh plates are stacked one above another in a direction in which the ingot conveyer unit conveys the ingot to the wire.

10. The wire sawing apparatus according to claim 8, wherein a total number of the openings in the first mesh plate is less than a total number of the openings in the second mesh plate, and the total number of the openings in the second mesh plate is less than a total number of the openings in the third mesh plate.

11. The wire sawing apparatus according to claim 3, wherein the upper portion of the dispersed slurry blocking unit is fixed to the support surface, and
wherein at least one of the lateral portion or the lower portion of the dispersed slurry blocking unit is shaped to be attachable to or detachable from the upper portion.

12. The wire sawing apparatus according to claim 3, wherein the lower portion of the dispersed slurry blocking unit is disposed such that the lower portion is to be inclined toward the ingot to be cut.

13. The wire sawing apparatus according to claim 12, wherein the lower portion has an inclination angle ranging from 7° to 10°.

14. The wire sawing apparatus according to claim 3, wherein the upper portion and the lateral portion are screwed together, and
wherein the lower portion and the lateral portion are separated from each other and connected to each other by a connection member.

15. The wire sawing apparatus according to claim 1, wherein a bottom of the dispersed slurry blocking unit is located higher than the wire.

16. The wire sawing apparatus according to claim 1, wherein the dispersed slurry blocking unit is disposed at a region that the wire enters and another region that the wire exits.

17. The wire sawing apparatus according to claim 1, wherein the dispersed slurry blocking unit is disposed such that the dispersed slurry blocking unit is to be parallel to the ingot to be cut in a longitudinal direction of the ingot to be cut.

18. The wire sawing apparatus according to claim 1, wherein the ingot conveyor unit includes:
   a feed table configured to lower the ingot toward the wire;
   a holder configured to fix the ingot to the feed table; and
   a beam element configured to connect the holder and the ingot to each other.

19. The wire sawing apparatus according to claim 1, further comprising:
   a wire roller having a groove configured to wind the wire and guide the wire;
   a slurry tank configured to accommodate the slurry to be supplied to the nozzle;
   a slurry bath configured to accommodate the slurry that has been outletted from the nozzle and used to saw the ingot;
   a first bobbin configured to wind the wire that is used to saw the ingot;
   a second bobbin configured to wind the wire that has sawn the ingot; and
   at least one pulley configured to change a movement path of the wire.

* * * * *